(12) United States Patent
Zhang et al.

(10) Patent No.: US 8,519,742 B2
(45) Date of Patent: Aug. 27, 2013

(54) LATCH STRUCTURE, FREQUENCY DIVIDER, AND METHODS FOR OPERATING SAME

(75) Inventors: Kun Zhang, Austin, TX (US); Kenneth Barnett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 13/253,350

(22) Filed: Oct. 5, 2011

(65) Prior Publication Data

US 2012/0025877 A1 Feb. 2, 2012

Related U.S. Application Data

(62) Division of application No. 12/552,810, filed on Sep. 2, 2009, now Pat. No. 8,058,901.

(60) Provisional application No. 61/098,665, filed on Sep. 19, 2008.

(51) Int. Cl.
*H03K 19/173* (2006.01)

(52) U.S. Cl.
USPC .............................................. 326/93; 326/46

(58) Field of Classification Search
USPC ................................................ 326/46, 93, 98
See application file for complete search history.

(56) References Cited

U.S. PATENT DOCUMENTS

| | | | |
|---|---|---|---|
| 5,281,865 A | 1/1994 | Yamashita et al. | |
| 5,841,298 A | 11/1998 | Huang | |
| 6,163,182 A | 12/2000 | Canard et al. | |
| 6,239,640 B1 | 5/2001 | Liao et al. | |
| 6,389,095 B1 | 5/2002 | Sun | |
| 7,342,429 B2 * | 3/2008 | Austin et al. | 327/202 |
| 7,373,572 B2 | 5/2008 | Mak et al. | |

(Continued)

FOREIGN PATENT DOCUMENTS

| | | |
|---|---|---|
| DE | 4340966 C1 | 1/1995 |
| EP | 0926833 A1 | 6/1999 |

(Continued)

OTHER PUBLICATIONS

International Search Report and Written Opinion—PCT/US2009/057555, International Search Authority—European Patent Office—Jul. 30, 2010.

(Continued)

*Primary Examiner* — Don Le
(74) *Attorney, Agent, or Firm* — Kevin T. Cheatham

(57) ABSTRACT

A latch includes three circuits. The first circuit drives a first output (QB) to a first level when a first input (D) and a first clock phase (CK) are both low, to a second level when D and CK are both high, and provides high impedance (HI-Z) when different logic levels are applied to D and CK. The second circuit drives a second output (Q) to the first level when a third input (DB) and a complimentary clock phase (CKB) are both low, to the second level when DB and CKB are both high, and provides HI-Z when different logic levels are applied to DB and CKB. The third circuit maintains voltages of Q and QB when the first and second circuits provide HI-Z at Q and QB. Odd-number dividers constructed with such latches produce 50% duty cycle operation without restricting output pulse widths to integer multiples of input periods.

19 Claims, 4 Drawing Sheets

(56) References Cited

U.S. PATENT DOCUMENTS

| | | | |
|---|---|---|---|
| 7,443,197 | B2 | 10/2008 | Hoberman et al. |
| 7,453,294 | B1 | 11/2008 | Wang et al. |
| 8,058,901 | B2 | 11/2011 | Zhang et al. |
| 2004/0160247 | A1* | 8/2004 | Magoon et al. ............... 327/115 |
| 2004/0251935 | A1* | 12/2004 | Chen et al. ................... 327/117 |
| 2005/0253630 | A1 | 11/2005 | Huang et al. |
| 2006/0033523 | A1 | 2/2006 | Erstad et al. |
| 2006/0168487 | A1 | 7/2006 | Mak et al. |
| 2007/0286328 | A1* | 12/2007 | Molnar et al. ................. 377/47 |
| 2008/0164927 | A1* | 7/2008 | Wang ............................ 327/254 |
| 2008/0258780 | A1* | 10/2008 | Wood ............................ 327/117 |
| 2008/0265953 | A1 | 10/2008 | Acar et al. |
| 2009/0251176 | A1* | 10/2009 | Miller ........................... 327/115 |
| 2009/0296878 | A1 | 12/2009 | Tsai |
| 2010/0134154 | A1* | 6/2010 | He ................................ 327/115 |
| 2010/0195374 | A1 | 8/2010 | Rennie et al. |

FOREIGN PATENT DOCUMENTS

| | | |
|---|---|---|
| EP | 1241788 A1 | 9/2002 |
| EP | 1487108 A1 | 12/2004 |
| JP | 5095281 A | 4/1993 |
| JP | 6029791 A | 2/1994 |
| JP | 11008550 A | 1/1999 |
| JP | 2003512752 A | 4/2003 |
| WO | WO0129965 A1 | 4/2001 |

OTHER PUBLICATIONS

Lee S-H et al: "A Divide-by-16.5 Circuit for 10-Gb Ethernet Transceiver in 0.13- μm CMOS," IEEE Journal of Solid-State Circuits, IEEE Service Center, Piscataway, NJ, US, vol. 40, No. 5, May 1, 2005, pp. 1175-1179.

Magoon R., et al., "RF local oscillator path for GSM direct conversion transceiver with true 50% duty cycle divide by three and active third harmonic cancellation, IEEE Radio Frequency Integrated Circuits Symposium, LNKDD0I: 10.1109/RFIC.2002.1011502, XP002277201 ISBN: 978-0-7803-7246-7 Section IV," IEEE Radio Frequency Integrated Circuits, Symposium. Digest of Papers, 2002, No. 501, 23-26.

Partial International Search Report—PCT/US2009/057555—International Search Authority, European Patent Office, Apr. 12, 2010.

* cited by examiner

US 8,519,742 B2

LATCH STRUCTURE, FREQUENCY DIVIDER, AND METHODS FOR OPERATING SAME

CLAIM OF PRIORITY UNDER 35 U.S.C. §119

This application is a divisional application of U.S. patent application Ser. No. 12/552,810 filed on Sep. 2, 2009, which claims priority to Provisional U.S. Patent Application Ser. No. 61/098,665, entitled "LATCH STRUCTURE AND FREQUENCY DIVIDER," filed on Sep. 19, 2008, which is assigned to the assignee hereof and hereby expressly incorporated by reference herein in its entirety.

BACKGROUND

1. Field

The present invention relates generally to electronic circuits and communication apparatus. More particularly, in aspects the invention relates to latches, frequency dividers, synthesizers, and wireless communication devices employing such devices.

2. Background

Frequency dividers are used in various electronic devices, including portable wireless devices such as cellular telephones and personal digital assistants. Output waveforms of a frequency divider are typically derived from either the rising edges or the falling edges of the divider's input. For this reason, odd number dividers (e.g., divide by 3, 5, 7, etc.) have outputs that are commonly restricted to pulse widths that are integer multiples of the period of their inputs. Since a full output cycle of an odd number frequency divider is equal to an odd number of its input cycle duration, getting a fifty percent duty cycle generally requires pulse widths that correspond to a non-integer number of input cycles. This may unnecessarily restrict the frequency choices available to designers of the equipment using the odd number dividers.

A need thus exists for frequency dividers, frequency divider components such as latches, and methods for operating frequency dividers that overcome the above-described limitation of existing circuits and do not unduly restrict the choice of operating frequency when dividing by an odd number. A further need exists for communication apparatus, including wireless communication apparatus, with such dividers.

SUMMARY

Embodiments disclosed herein may address one or more of the needs described above by providing a latch structure that can transition on both rising and falling edges of the input, embodiments of frequency dividers made with such latch structure, and embodiments of receivers and transmitters employing such frequency dividers.

In an embodiment, an electronic latch includes a first circuit configured to drive a first output to a first output logic level (e.g., low) when a first input is at a first input logic level (e.g., high) and a second input is at the first input logic level, drive the first output to a second output logic level (e.g., high) different from the first output logic level when the first input is at a second input logic level (e.g., low) and the second input is at the second input logic level, and set the first output to a high impedance state when different input logic levels are applied to the first input and to the second input. The electronic latch also includes a second circuit configured to drive a second output to the first output logic level when a third input is at the first input logic level and a fourth input is at the first input logic level, drive the second output to the second output logic level when the third input is at the second input logic level and the fourth input is at the second input logic level, and set the second output to the high impedance state when different input logic levels are applied to the third input and to the fourth input. The electronic latch further includes a third circuit configured to maintain voltage levels of the first and second outputs when the first circuit drives the first output to the high impedance state and the second circuit drives the second output to the high impedance state.

In an embodiment, an electronic latch includes a means for driving a first output to a first output level when a first input is at a first input level and a second input is at the first input level, driving the first output to a second output level different from the first output level when the first input is at a second input level and the second input is at the second input level, and setting the first output to a high impedance state when different input levels are applied to the first input and to the second input. The electronic latch also includes a means for driving a second output to the first output level when a third input is at the first input level and a fourth input is at the first input level, driving the second output to the second output level when the third input is at the second input level and the fourth input is at the second input level, and setting the second output to the high impedance state when different input levels are applied to the third input and to the fourth input. The electronic latch further includes a means for maintaining voltage level of the first and second outputs when the means for driving the first output drives the first output to the high impedance state, and the means for driving the second output drives the second output to the high impedance state.

In an embodiment, a frequency divider includes a plurality of latches. Each latch of the plurality of latches is configured selectively to switch state on both rising and falling edges of a clock.

In an embodiment, a method is provided for operating an electronic latch. The method includes driving a first output with a first output logic level in response to a first input and a first clock phase being at a first input logic level. The method also includes driving a second output with the first output logic level in response to a second input and a second clock phase being at the first input logic level. The method additionally includes driving the first output with a second output logic level in response to the first input and the first clock phase being at a second input logic level. The method further includes driving the second output with the second output logic level in response to the second input and the second clock phase being at the second input logic level. The method further includes providing a high impedance at the first output in response to the first input and the first clock phase being at different input logic levels. The method further includes providing the high impedance at the second output in response to the second input and the second clock phase being at different input logic levels. The method further includes maintaining logic levels of the first and second outputs when the first input and the first clock phase are at different input logic levels, and the second input and the second clock phase are at different input logic levels.

These and other aspects of the present invention will be better understood with reference to the following description, drawings, and appended claims.

DETAILED DESCRIPTION

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expressions "alternative embodiment," "alternatively," and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

Figure 1B:
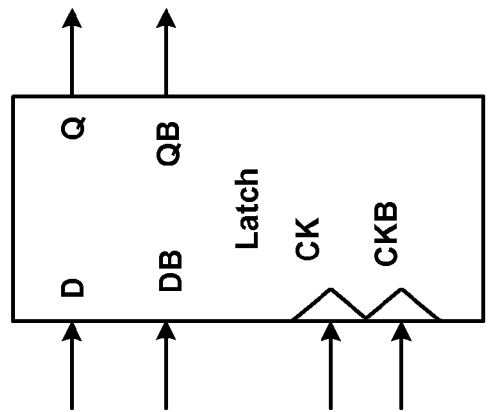
FIG. 1B illustrates a circuit symbol for the latch of FIG. 1A.
Figure 1A:
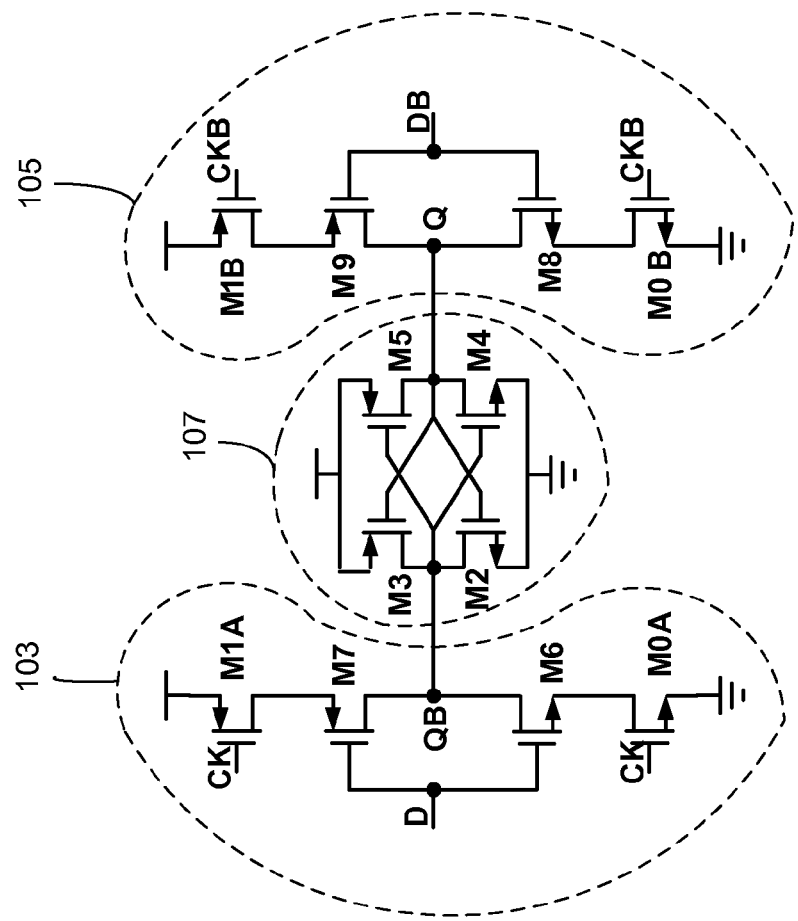
FIG. 1A illustrates selected components of a latch.

FIGS. 1A and 1B illustrate, respectively, selected components of exemplary latch 100 and a circuit symbol for the same latch 100. The latch 100 may be used in a frequency divider, as will be discussed below.

For explanatory purposes, the selected components of the latch 100 shown in FIG. 1A may be divided into three transistor groups. In FIG. 1A, a first transistor group 103 includes transistors M1A, M7, M6, and M0A. A second transistor group 105 includes transistors M1B, M9, M8, and M0B. A third transistor group 107 includes a pair of cross-coupled inverters with transistors M2, M3, M4, and M5. Note that in the Figures, DB stands for $\overline{D}$ (D-bar), or the inverted signal of the D input; similarly, QB stands for $\overline{Q}$ (Q-bar), or the inverted signal of the $\overline{Q}$ output; and CKB stands for $\overline{CK}$ (CK-bar), or the inverted clock signal of the CK input.

Let us first look at the operation of the first transistor group 103 of the latch 100. When both D and CK are high, the transistors M1A and M7 are in the OFF state (not conducting), and the transistors M0A and M6 are in the ON state (conducting). Consequently, the $\overline{Q}$ output is pulled down. Conversely, when both D and CK are low, the transistors M1A and M7 are in the ON state, and the transistors M0A and M6 are in the OFF state. Consequently, the $\overline{Q}$ output is pulled high. Finally, when the state of CK is opposite the state of D (D is high while CK is low, or vice versa), it is easy to see that the transistor group 103 of the latch 100 provides a high impedance at $\overline{Q}$, because one of the transistors M1A/M7 is OFF, and one of the transistors M0A/M6 is also OFF. As shown on FIG. 1A, we assume a positive supply voltage $V_{DD}$ here, although the polarities may differ in other embodiments without necessarily departing from the scope of the invention. Thus, the circuit may operate with the ground potential connected to the sources of M1A and M1B, and $V_{SS}$ connected to the sources of M0A and M0B. Further, N-channel transistors may be substituted for the P-channel transistors, and vice versa, as a person skilled in the art would understand without difficulty after perusal of this disclosure.

The operation of the second transistor group 105 of the latch 100 is analogous to the operation of the first transistor group 103, with the necessary changes to the reference designators. In other words, when both $\overline{D}$ and $\overline{CK}$ are high, the transistors M1B and M9 are in the OFF state (not conducting), and the transistors M0B and M8 are in the ON state (conducting). Consequently, the Q output is pulled down. Conversely, when both $\overline{D}$ and $\overline{CK}$ are low, the transistors M1B and M9 are in the ON state, and the transistors M0B and M8 are in the OFF state. Consequently, the Q output is pulled high. Finally, when the state of $\overline{CK}$ is opposite the state of $\overline{D}$ ($\overline{D}$ is high while $\overline{CK}$ is low, or vice versa), the second transistor group 105 of the latch 100 provides a high impedance at Q, because one of the transistors M1B/M9 is OFF, and one of the transistors M0B/M8 is also OFF.

Turning next to the operation of the cross-coupled inverters made with the transistors M2-M5 of the third transistor group 107, this circuit maintains the logic state of the $\overline{Q}$ and Q outputs when the first and second transistor groups 103 and 105 of the latch 100 do not drive $\overline{Q}$ and Q with low or high logic values, but instead provide high impedances at these outputs. This is the case when the levels of D and CK differ (and, of course, the levels of $\overline{D}$ and $\overline{CK}$ also differ at the same time). For illustration, consider the case when Q is high and $\overline{Q}$ is low. Then, the transistors M2 and M5 are ON, and the transistors M3 and M4 are OFF. Consequently, the cross-coupled transistors M2-M5 pull $\overline{Q}$ low and pull Q high. If the first transistor group 103 and the second transistor group 105 of the latch 100 begin to provide high impedances at Q and $\overline{Q}$, the transistors M2-M5 continue to drive Q and $\overline{Q}$ to high and low, respectively. The operation is symmetrical when Q is low and $\overline{Q}$ is high. In either case, the previously-existing (i.e., existing just before the first and second transistor groups 103/105 began to provide high impedance at Q and $\overline{Q}$) logic states of Q and $\overline{Q}$ continue to be maintained.

Thus, when D and CK are high, Q and $\overline{Q}$ assume corresponding voltage levels (high and low, respectively); and when D and CK are low, Q and $\overline{Q}$ assume corresponding voltage levels (low and high, respectively). When the state of only one of the D and CK inputs changes, the first and second transistor groups 103/105 provide high impedances on Q and $\overline{Q}$, and the cross-coupled inverters of the third transistor group 107 maintain the voltage levels that Q and $\overline{Q}$ assumed just before the divergence of the D and CK inputs.

The latch 100 can thus change states not only on either the rising or the falling edges of CK, but on both the rising and the falling edges of CK.

Figure 2:
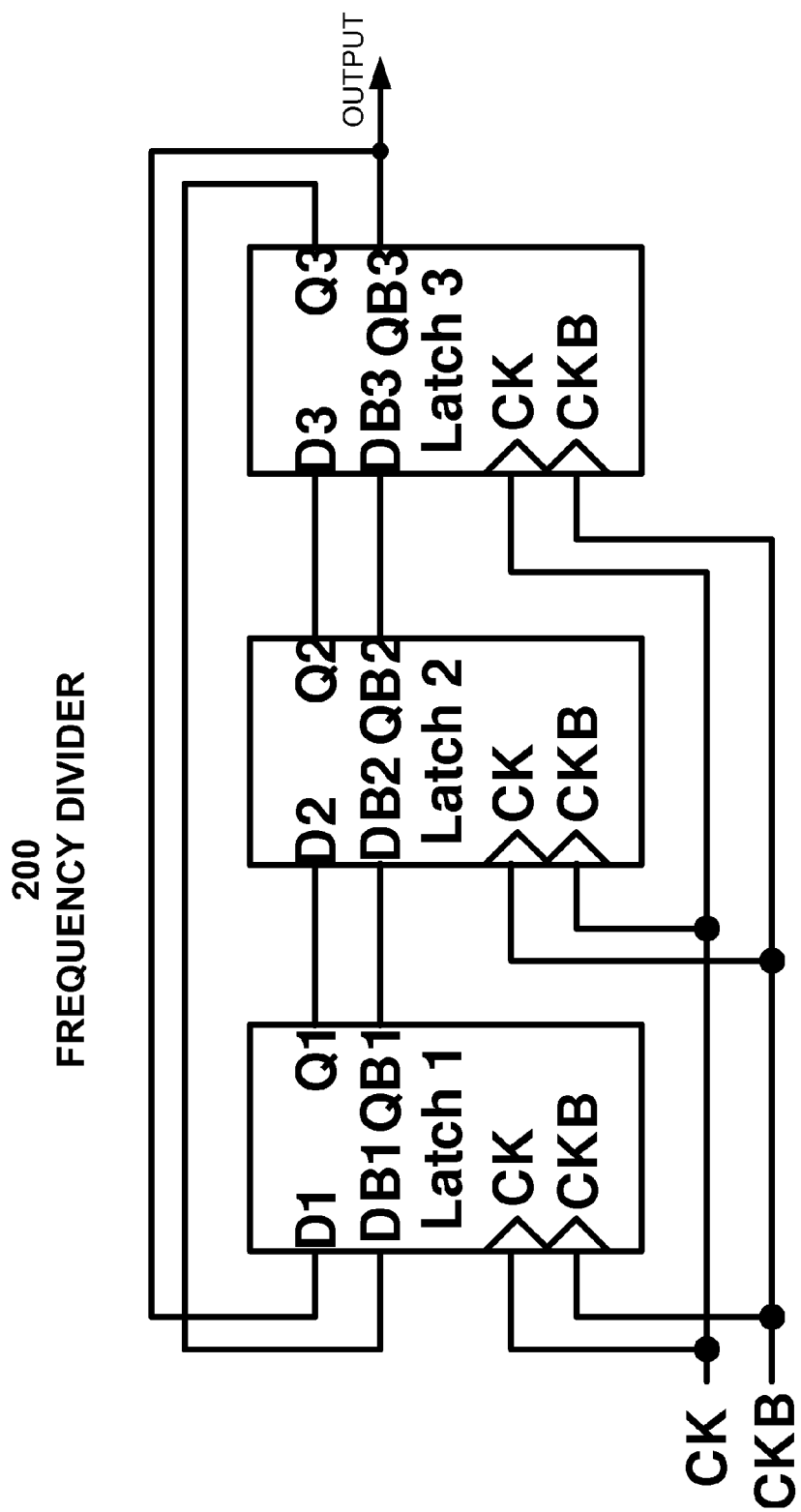
FIG. 2 illustrates selected components of a frequency divider.

FIG. 2 illustrates selected components of a frequency divider 200 that includes three latches (Latch 1, Latch 2, and Latch 3), each of which is configured to transition on both rising and falling edges of the clock CK. In a variant, each of the three latches is identical or substantially the same as the latch 100 shown in FIGS. 1A and 1B, with the same reference designators used in FIG. 1 and FIG. 2. The frequency divider 200 is configured to divide by three and provide at its outputs (Q3 and/or QB3 of the Latch 3, for example) waveforms with a duty cycle of substantially fifty percent.

Figure 3:
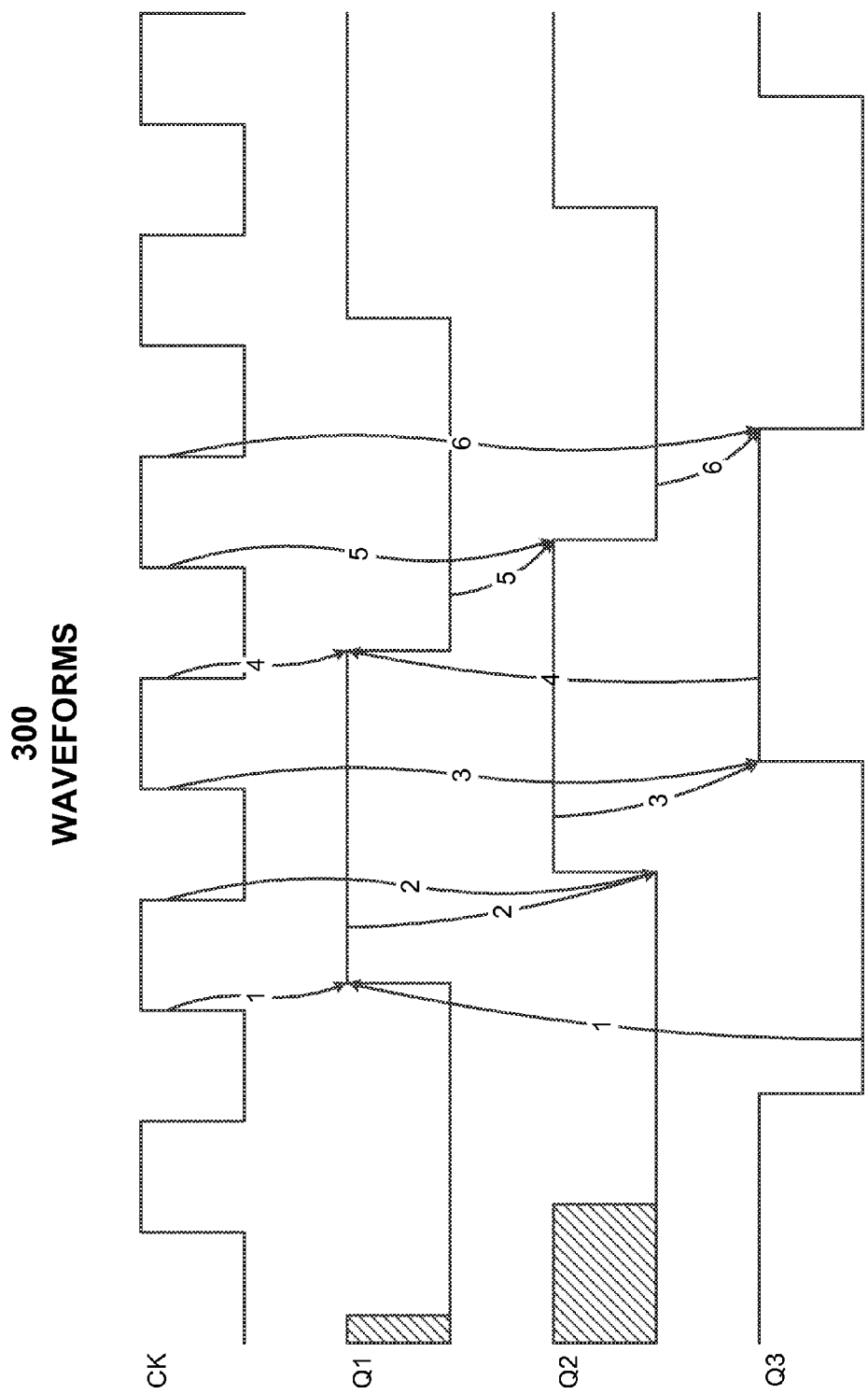
FIG. 3 illustrates timing aspects of the frequency divider of FIG. 2.

FIG. 3 illustrates selected timing aspects of the operation of the frequency divider 200. The shaded areas in FIG. 3 correspond to unknown states/transitions, and are not discussed below. The reference designator Q1 refers to the Q output of the Latch 1, Q2 refers to the Q output of the Latch 2, and Q3 refers to the Q output of the Latch 3. The reference designator Q3 also refers to one of the outputs of the frequency divider 200 as a whole.

The arrows in FIG. 3 indicate causal relationships between states and transitions. Thus, the arrows "1" show that the first (in time, i.e., leftmost in FIG. 3) transition of Q1 from low to high takes place because of a CK rising edge occurring while Q3 is low. The arrows "2" show that the first rising edge of Q2 then follows, as a result of the following falling edge of CK while Q1 is remains high. The arrows "3" indicate that the falling edge of Q3 then occurs as a result of the CK rising edge while Q2 is high. Similarly, the arrows "4" indicate that the next falling edge of Q1 results from the falling edge of CK while Q3 remains high, the arrows "5" indicate that the next falling edge of Q2 results form the CK rising edge while Q1 is low, and the arrows "6" indicate that the following falling edge of Q3 is a result of CK falling edge while Q2 is low.

As can be seen from FIGS. 2 and 3, and would be readily understood by a person of ordinary skill in the art after perusal of this document and of the accompanying Figures, the state transitions of Q in each of the Latches 1-3 take place on both rising and falling edges of the clock CK (and CKB), which is divided by three at the output Q3.

The frequency divider 200, or another frequency divider made with latches in accordance with the embodiment shown in FIG. 1A, may be used in a receiver and/or transmitter of a wireless communication device, such as a cellular telephone or a personal digital assistant. For example, such frequency dividers may be used in the feedback path of a phase lock lop (PLL) of a synthesizer, to divide a reference frequency inputted into a synthesizer, or to divide the output of a synthesizer.

Figure 4:
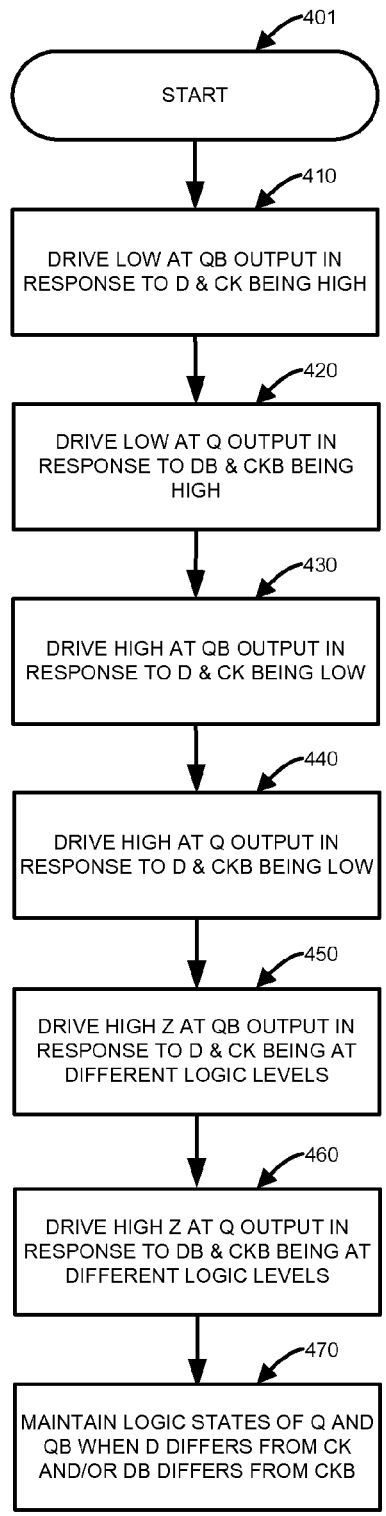
FIG. 4 illustrates selected steps of a process of operating a latch configured to transition on both rising and falling edges.

FIG. 4 illustrates selected steps of a method 400 of operating a latch configured to transition on both rising and falling clock edges, such as the latch 100 of FIGS. 1A and 1B.

At a flow point 410, the latch is configured, powered up, and ready to operate.

At a step 410, a first circuit (103) in the latch generates a first output logic level (e.g., a logic low) of a first output ($\overline{Q}$) in response to a first input (D) and a first phase of a clock (CK) each being at a first input logic level (e.g., a logic high).

At a step 420, a second circuit (105) in the latch generates the first output logic level of a second output (Q) in response to a second input ($\overline{D}$) and a second phase of the clock ($\overline{CK}$) each being at the first input logic level.

At a step 430, the first circuit in the latch generates a second output logic level (e.g., a logic high) of the first output in response to the first input and the first phase of the clock each being at a second input logic level (e.g., a logic low).

At a step 440, the second circuit in the latch generates a second output logic level (e.g., a logic high) of the second output in response to the second input and the second phase of the clock each being at the second input logic level (e.g., a logic low).

At a step 450, the first circuit in the latch generates a high impedance state at the first output in response to the first input and the first phase of the clock being at different input logic levels (e.g., the clock is high and the first input is low, or vice versa).

At a step 460, the second circuit in the latch generates a high impedance state at the second output in response to the second input and the second phase of the clock being at different input logic levels (e.g., the clock is high and the second input is low, or vice versa).

At a step 470, a third circuit (107) in the latch maintains the logic states of the first and second outputs that were in existence immediately before the states of the first phase of the clock and the first inputs became different, or the states of the second phase of the clock and the second input became different.

The steps of the method 400 may be repeated continually as needed.

As a person skilled in the art would understand after perusal of this disclosure, odd number frequency dividers in accordance with this document may implement division numbers other than three, for example, five, seven, nine, or any other odd number. The dividers may be implemented in chains that include other dividers, so that the total division ratio of the chain may be odd, even, and/or programmable. The person skilled in the art would further understand, after perusal of this disclosure, that the latches in accordance with this document may be implemented using differential signals, both input and output. In fact, the embodiments and variants described above and illustrated in the Figures can be differential if the ground symbol is replaced with the inverting input/output differential reference level ("−"), and the inputs (Q and QB) and outputs (D and DB) are considered to be the non-inverting differential inputs/outputs ("+"). Odd number dividers can then be configured using the principles illustrated in FIGS. 2 and 3.

Although steps and decision blocks of various methods may have been described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences described above and/or shown in the accompanying Figures. Furthermore, not every illustrated step and decision may be required in every system, while some steps and decisions that have not been specifically illustrated may be desirable or necessary in some systems.

Those of skill in the art would understand that the communication techniques that are described in this document may be used for unidirectional traffic transmissions as well as for bidirectional traffic transmissions.

Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make or use the present invention. Various modifications to these embodiments will be readily apparent to those skilled in the art, and the generic principles defined herein may be applied to other embodiments. Thus, the present invention is not intended to be limited to the embodiments shown herein, but is to be accorded the widest scope consistent with the principles and novel features disclosed herein.

What is claimed is:

1. A frequency divider comprising a plurality of latches, each latch of the plurality of latches being configured selectively to switch state on both rising and falling edges of a clock, wherein each latch of the plurality of latches comprises a first circuit configured to drive a first output, a second circuit configured to drive a second output, and a third circuit configured to maintain voltage levels of the first and second outputs when the first circuit drives the first output to a high impedance state and the second circuit drives the second output to the high impedance state.

2. The frequency divider of claim 1, wherein the plurality of latches is configured to divide frequency of the clock by an odd number to obtain at least one output with a duty cycle equal substantially to fifty percent.

3. A wireless device comprising a radio frequency section, the radio frequency section comprising the frequency divider of claim 2.

4. The frequency divider of claim 2, wherein the odd number is three.

5. The frequency divider of claim 2, wherein the odd number is five.

6. The frequency divider of claim 2, wherein the odd number is greater than five.

7. The frequency divider of claim 1, wherein:
the first circuit is configured to drive the first output to a first output logic level when a first input is at a first input logic level and a second input is at the first input logic level, to drive the first output to a second output logic level different from the first output logic level when the first input is at a second input logic level and the second input is at the second input logic level, and to set the first output to a high impedance state when different input logic levels are applied to the first input and to the second input;
second circuit is configured to drive the second output to the first output logic level when a third input is at the first input logic level and a fourth input is at the first input logic level, to drive the second output to the second output logic level when the third input is at the second input logic level and the fourth input is at the second input logic level, and to set the second output to the high impedance state when different input logic levels are applied to the third input and to the fourth input; and
the third circuit comprises a plurality of P-channel transistors.

8. The frequency divider of claim 7, wherein the third circuit comprises a pair of cross-coupled inverters.

9. A method of operating a frequency divider having a plurality of latches, the method comprising:
driving a first latch of the plurality of latches with a clock signal and a feedback input from a last latch of the plurality of latches;
selectively switching state of the first latch on both rising and falling edges of the clock signal based on the feedback input;
driving one or more subsequent latches of the plurality of latches with the clock signal and an output signal from a previous latch to the one or more subsequent latches;
selectively switching state of the one or more subsequent latches on both rising and falling edges of the clock signal based on the output signal driving the subsequent latches;
driving the last latch of the plurality of latches with the clock signal and the output signal from the previous latch to the last latch;
selectively switching state of the last latch on both rising and falling edges of the clock signal based on the output signal from the previous latch to the last latch, wherein the last latch outputs the feedback input; and
wherein operation of each of the plurality of latches comprises:
providing a high impedance at a first output;
providing the high impedance at a second output; and
maintaining logic levels of the first and second outputs when a first input and a first clock phase are at different input logic levels and a second input and a second clock phase are at different input logic levels.

10. The method of claim 9, wherein operation of each of the plurality of latches further comprises:
driving the first output with a first output logic level in response to the first input and the first clock phase being at a first input logic level;
driving the second output with the first output logic level in response to the second input and the second clock phase being at the first input logic level;
driving the first output with a second output logic level in response to the first input and the first clock phase being at a second input logic level;
driving the second output with the second output logic level in response to the second input and the second clock phase being at the second input logic level;
providing the high impedance at the first output in response to the first input and the first clock phase being at different input logic levels; and providing the high impedance at the second output in response to the second input and the second clock phase being at different input logic levels.

11. The method of claim 9, further comprising:
dividing, by the plurality of latches, a frequency of the clock signal by an odd number to obtain at least one output with a duty cycle equal substantially to fifty percent.

12. The method of claim 11, wherein the odd number comprises one of:
three;
five; and
greater than five.

13. A method for operating a wireless communication device comprising a frequency generator, the frequency generator comprising a frequency divider, the method for operating the wireless communication device comprising operating the frequency divider in accordance with the method claim 9.

14. A frequency divider having a plurality of latches, the frequency divider comprising:
means for driving a first latch of the plurality of latches with a clock signal and a feedback input from a last latch of the plurality of latches;
means for selectively switching state of the first latch on both rising and falling edges of the clock signal based on the feedback input;
means for driving one or more subsequent latches of the plurality of latches with the clock signal and an output signal from a previous latch to the one or more subsequent latches;
means for selectively switching state of the one or more subsequent latches on both rising and falling edges of the clock signal based on the output signal driving the subsequent latches;
means for driving the last latch of the plurality of latches with the clock signal and the output signal from the previous latch to the last latch;
means for selectively switching state of the last latch on both rising and falling edges of the clock signal based on the output signal from the previous latch to the last latch, wherein the last latch outputs the feedback input; and
wherein operation of each of the plurality of latches comprises:
means for providing a high impedance at a first output;
means for providing the high impedance at a second output; and
means for maintaining logic levels of the first and second outputs when a first input and a first clock phase are at different input logic levels and a second input and a second clock phase are at different input logic levels.

15. The frequency divider of claim 14, wherein operation of each of the plurality of latches further comprises:
means for driving the first output with a first output logic level in response to the first input and the first clock phase being at a first input logic level;
means for driving the second output with the first output logic level in response to the second input and the second clock phase being at the first input logic level;
means for driving the first output with a second output logic level in response to the first input and the first clock phase being at a second input logic level;
means for driving the second output with the second output logic level in response to the second input and the second clock phase being at the second input logic level;
means for providing the high impedance at the first output in response to the first input and the first clock phase being at different input logic levels; and
means for providing the high impedance at the second output in response to the second input and the second clock phase being at different input logic levels.

16. The frequency divider of claim 14, further comprising:
means for dividing, by the plurality of latches, a frequency of the clock signal by an odd number to obtain at least one output with a duty cycle equal substantially to fifty percent.

17. The frequency divider of claim 16, wherein the odd number comprises one of:
three;
five; and
greater than five.

18. A wireless device comprising a radio frequency section, the radio frequency section comprising the frequency divider of claim 14.

19. A wireless communication device comprising a frequency generator, the frequency generator comprising a frequency divider, the frequency divider being in accordance with claim 14.

* * * * *